United States Patent [19]

Rabarot et al.

[11] Patent Number: 5,981,360
[45] Date of Patent: Nov. 9, 1999

[54] ASSEMBLY PROCEDURE FOR TWO STRUCTURES AND APPARATUS PRODUCED BY THE PROCEDURE APPLICATIONS TO MICROLASERS

[75] Inventors: Marc Rabarot, Seyssinet; Laurent Fulbert, Voiron, both of France

[73] Assignee: Commissariat a L'Energie Atomique, Paris, France

[21] Appl. No.: 08/893,314

[22] Filed: Jul. 16, 1997

[30] Foreign Application Priority Data

Jul. 17, 1996 [FR] France .................................. 96 08943

[51] Int. Cl.$^6$ .................................................... H01L 21/20
[52] U.S. Cl. ................ 438/455; 364/468.02; 364/468.21
[58] Field of Search .................... 438/455, 458; 364/468.02, 468.21, 468.28

[56] References Cited

U.S. PATENT DOCUMENTS

| | | |
|---|---|---|
| 5,495,494 | 2/1996 | Molva et al. . |
| 5,564,181 | 10/1996 | Dineen et al. . |
| 5,689,106 | 11/1997 | Dahlin . |
| 5,734,156 | 3/1998 | Dahlin et al. . |
| 5,759,753 | 6/1998 | Namba et al. . |
| 5,773,884 | 6/1998 | Andros et al. . |
| 5,791,552 | 8/1998 | Werther . |
| 5,812,232 | 9/1998 | Shiroto et al. . |
| 5,821,762 | 10/1998 | Hamaguchi et al. . |
| 5,831,238 | 11/1998 | Takuya et al. . |
| 5,847,438 | 12/1998 | Kikuchi et al. . |

*Primary Examiner*—Chandra Chaudhari
*Assistant Examiner*—Martin Sulsky
*Attorney, Agent, or Firm*—Bruce F. Jacobs

[57] ABSTRACT

This invention relates to a procedure for assembling two structures (2, 4) comprising:
- formation on at least one of the structures of studs (12, 14, 16) made of a material that can flow and is wettable on both structures,
- positioning of the two structures such that said studs are on their interface,
- assembly of the two structures by heating the studs causing them to flow, and by bringing the two structures together as intimately as possible.

According to a different procedure, joints made of a fluidizable, wettable material are incorporated in notches etched into one of the structures to be assembled.

Application to microlasers.

13 Claims, 10 Drawing Sheets

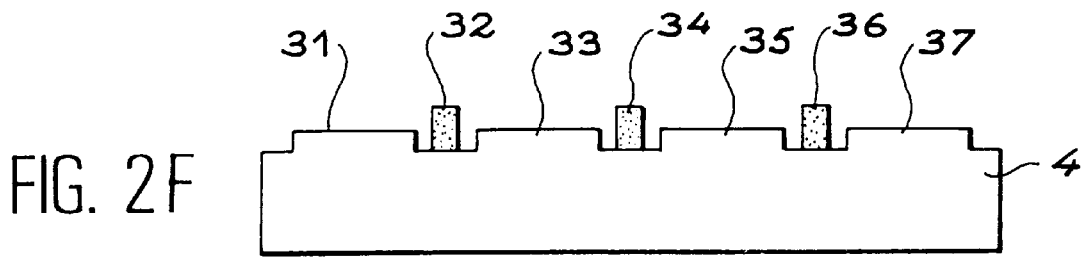
FIG. 2F
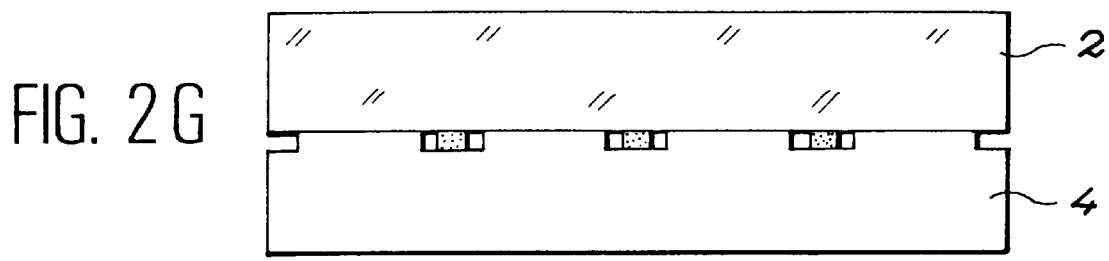
FIG. 2G
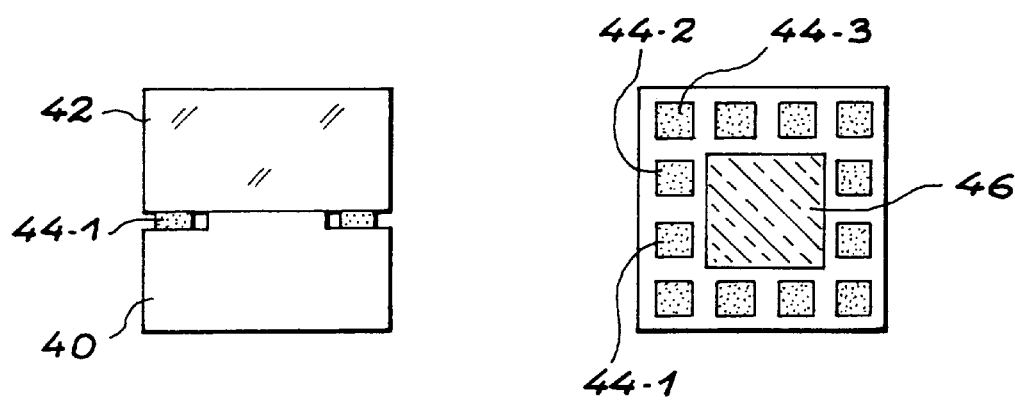
FIG. 3A
FIG. 3B

ASSEMBLY PROCEDURE FOR TWO STRUCTURES AND APPARATUS PRODUCED BY THE PROCEDURE APPLICATIONS TO MICROLASERS

FIELD OF THE INVENTION

This invention relates to techniques for assembling two structures, and particularly structures requiring good mechanical resistance and parallel facing surfaces.

The invention relates particularly to the field of optronics, for example solid microlasers pumped by diodes and associated micro-optical components.

The invention also concerns the field of microlasers and microlaser cavities with solid active mediums.

Microlasers have many applications in fields as varied as the automobile industry, the environment, scientific instruments and telemetry.

A microlaser consists of a stack of multilayers.

The active laser medium consists of a small piece (a few square mm) of a thin film of material (between 150 and 1,000 µm thick) on which dielectric cavity mirrors are directly disposed. This active medium may be pumped by a III–V diode laser that is either directly hybridized on the microlaser or coupled to the microlaser by an optical fiber. The possibility of assembly-line production using microelectronics means ensures that such lasers can be mass produced.

PRIOR ART

In order to assemble two structures, the usual method is to use a film of glue between the two structures. However, this method does not give both good mechanical resistance of the assembly and good parallelism between the facing surfaces of the structures.

Concerning microlasers, document EP-653 824 (U.S. Pat. No. 5, 495,494) describes a procedure for producing a solid microlaser that is passively switched by a saturable absorber. The saturable absorber is disposed directly on the solid active medium as a thin film using liquid phase epitaxy (LPE).

However LPE cannot be used for all materials. In particular, when the active medium of the laser is not crystalline in structure, e.g. glass doped with erbium and/or ytterbium ions, LPE cannot be used. Similarly when an active medium microlaser cavity is combined with an active cavity switching device such as an electro-optical device such as that described in J.J. Zayhowski's article "Diode-pumped Microchip Lasers Electro-optically Q-switched at High Pulse Repetition Rates" (Optics Letters Vol. 17, No. 17, pages 1201–1203, 1992), LPE cannot be used. The same problem is encountered when a microlaser cavity is combined with a non-linear material such a frequency doubler or tripler or an optical parametric oscillator (OPO).

In all these special cases the manufacturing procedures developed include a hybridization phase between two plates of material, for example a plate of the material constituting the active laser medium and a plate of material constituting the active switching means or non-linear material. The two plates are glued together by means of an optical glue with a known refractive index (e.g. 1.5). The surfaces to be glued are first polished to a roughness of the order of a few angstroms RMS and they have a localized divergence in surface evenness of better than $\lambda/10$ (100 nm at $\lambda=1.06\,\mu m$). Once the other stages, such as forming the mirror layers, have been completed, the plates of material are cut to form individual microlaser cavities. Each cavity is then coupled to pumping means such as a III–V laser diode. The microlasers thereby produced only function correctly if natural optical loss and the thickness of the glue are slight and if the surface parallelism at the plate interfaces is also slight, i.e. less than approximately 10" arc. Moreover the glue must provide good adhesion to enable plate assemblies to be cut into chips; this operation is usually carried out using a diamond saw.

Irrespective of the structure assembled, but particularly when the structure is a microlaser, assembly using glue has several drawbacks:

firstly, the thickness of the glue bonding depends on the quantity of glue used, the initial quality of the application site and the pressure applied, in principle it is impossible to adjust the parallelism between two surfaces. One solution that has been tried is to reduce the thickness of the glue to the same order of magnitude as the irregularities in surface evenness, but no real control is possible. The result is therefore random, and thus a problem for mass production such as is used to produce microlaser cavities.

Glue can undergo changes over time, particularly where microlasers are concerned, under the influence of radiation or heating, thereby modifying the mechanical resistance and the parallelism of the assembly and components. The glue may also be subject to local degassing in active zones, thereby introducing additional losses.

The problem is thus to achieve assembly of two structures, in particular that of two microlaser cavity components, using a technique that allows both the parallelism and the mechanical resistance of the two structures or components to be controlled, thereby ensuring better aging qualities of the assembly.

DISCLOSURE OF THE INVENTION

The invention relates to a procedure for assembling two structures, comprising:

formation on at least one of the structures of studs made of a material that can flow and is wettable on both structures, positioning of the two structures such that said studs are at their interface, assembly of the two structures by heating the studs causing them to flow, and by bringing the two structures together as intimately as possible.

Two structures can thus be assembled in intimate contact by means of an adhesive substance. The use of studs made of a fluidizable, wettable material at the interface of the two structures ensures that when the two structures are brought together under pressure a joint is created that will ensure that the assembly holds together to allow the structures to be cut. In structures intended to be used to make microlaser cavities, cutting may be carried out with a diamond saw without weakening the mechanical resistance of the two structure assembly thereby effected.

Intimate contact between the two surfaces is understood to include both simple contact between said surfaces and contact using molecular adhesion forces such as Van der Waals forces or the use of adhesive substances such as glue, resin, etc.

This assembly method ensures excellent control of the parallelism of the contact surfaces. Normally, if it is applied to entire blanks of components or cutting, e.g. microlaser or micro-ootical components designed to be cut, the cutting operation can destroy the mechanical resistance of the elementary assemblies since the contact surface delimited by the cut lines is generally very small compared with the thickness of said elementary assemblies. Moreover, depending on the type of application, the materials placed in contact are not necessarily compatible: the surfaces may be physically and chemically different, or the materials used may have different thermomechanical coefficients.

The procedure according to the invention thus gives both good parallelism characteristics and good mechanical resistance.

The invention also relates to a procedure for assembling two structures comprising:

the creation of at least one spacer stud on the first of the two structures, the edges of said spacer stud(s) defining one or more lateral notches, each lateral notch presenting a bottom, the creation on the bottom of at least one lateral notch of a joint made of a material that is fluidizable and wettable on the two structures, positioning of the two structures such that said joint is at the interface, assembly of said structures by heating the joints causing them to flow, and by bringing the two structures together as intimately as possible.

A joint is understood to be any stud, strip or other component capable, after being caused to flow, of bonding the two structures together.

The invention also relates to a procedure for assembling two structures comprising:

the creation of at least one spacer stud in the first of the two structures, the edges of said spacer stud(s) defining one or more lateral notches, each lateral notch presenting a bottom, the creation on the second structure of at least one joint made of a material that is fluidizable and wettable on the two structures, positioning of the two structures so that each joint in the second structure is inserted into the notch of the first, assembly of the two structures by heating the joints causing them to flow, and by bringing the two structures together as intimately as possible.

In the second two procedures the material forming the fluidizable joint(s) can flow into said notch or notches and the two structures are brought into intimate contact, for example by molecular adhesion remote from the notches. The mechanical resistance of the assembly is essentially ensured by the fluidizable material in the notches and parallelism is ensured by said intimate contact.

If only spacer studs and their matching notches are created, said studs of fluidizable material are preferably located so that when the studs flow they create the thinnest possible film of uniform thickness. The characteristics of the studs are therefore determined to provide a uniform film of minimum thickness.

The fluidizable, wettable material may be a photosensitive resin or a meltable material of the silica Sol-Gel (SOG) type, an In or Pb-Sn metal alloy or a negative resin. The latter gives better adhesion after reticulation of the polymer.

Irrespective of the envisaged embodiment, two structures assembled according to the invention can subsequently be cut. The cutting phase does not affect the intimate contact due to the mechanical resistance provided by the fluidizable material components.

The invention also relates to the assembly of a first and second structure each having at least one plane surface, said plane surfaces being in intimate contact, an adhesive joint made of a fluidizable, wettable material being disposed at the interface of the two plane surfaces.

The invention also relates to the assembly of a first and second structure each having at least one plane surface, one of said plane surfaces also comprising at least one lateral notch whose bottom is set back from the plane surface, the two plane surfaces being in intimate contact, an adhesive joint made of a fluidizable, wettable material being disposed in at least one lateral notch and joining the two structures.

These assemblies solve the same problems and have the same advantages as those described above in relation to the disclosure of the procedures: the parallelism of the contact surfaces of the two structures is ensured by the intimate contact and good mechanical resistance is ensured by the use of an adhesive joint made of a fluidizable, wettable material.

The first and second structures may be a solid active medium for a microlaser cavity and a saturable absorber for a microlaser cavity respectively.

Similarly, the first and second structures may be, respectively, a solid active medium for a microlaser cavity and a component made of an optically non-linear material, e.g. a frequency doubler or tripler, or an optical parametric oscillator.

In another embodiment, the first and second structures may be a solid active medium for a microlaser cavity and a micro-optical component such as a microprism, micromirror, etc. They may, in fact, be any type of micro-optical components.

The invention also relates to an assembly for a microlaser cavity comprising a solid active medium, an intermediate plane mirror disposed on one plane surface of the active laser medium, a component made of a material whose optical index can be modulated by outside perturbation, this component having a plane surface that is in intimate contact with the mirror, a joint made of a fluidizable, wettable material being disposed at the interface formed by the two plane surfaces.

The invention also relates to an assembly for a microlaser cavity comprising a solid active medium, an intermediate plane mirror disposed on one plane surface of the active laser medium, a component made of a material whose optical index can be modulated by outside perturbation, this component having a plane surface, the mirror and possibly the active medium and/or the modulable-index component having at least one lateral notch with a bottom set back from the plane surface in question, the plane surface of the modulable-index component being in intimate contact with the intermediate plane mirror, an adhesive joint made of a fluidizable, wettable material being disposed in at least one lateral notch and bonding the modulable-index component and the solid active medium.

An actively-switched microlaser cavity assembly is thus produced.

The invention also relates to an apparatus for emitting infrared light comprising an assembly like that described above in which the first and second structures respectively are:

a semiconductor component able to emit infrared radiation, a microlaser cavity incorporating switching means disposed so as to oprically pump the semiconductor component.

BRIEF DESCRIPTION OF THE FIGURES

The characteristics and advantages of the invention will be better understood in the light of the following description.

The description concerns examples of embodiments that are given for explanatory purposes and are not intended to be limitative. The description refers to the attached drawings in which:

FIGS. 2A to 2G show stages in a procedure according to a second embodiment of the invention, FIGS. 3A and 3B show top and side views of an apparatus produced using a procedure according to the second embodiment of the invention.

DETAILED DISCLOSURE OF EMBODIMENTS OF THE INVENTION

Figure 1A:
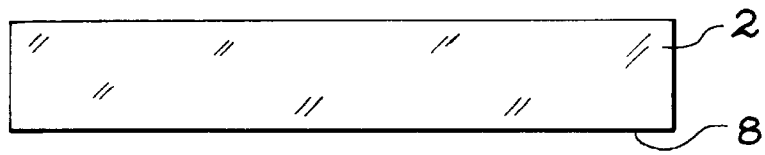
FIGS. 1A to 1E show stages in a procedure according to a first embodiment of the invention.

The stages in a procedure according to a first embodiment of the invention are shown in FIGS. 1A to 1E. In these figures references 2 and 4 designate two structures to be assembled. These structures are, for example, a section 4 of an active laser material and a section 2 of a saturable absorber material. Examples of materials for these two components are given in document EP-653 824 (U.S. Pat. No. 5,495,494); these documents also give criteria for selecting said materials.

In another example, structure 4 may be a section of a saturable absorber material while structure 2 is a section of an optically non-linear material capable of multiplying the basic frequency of a microlaser cavity by a whole number n (n≧2).

Figure 1B:
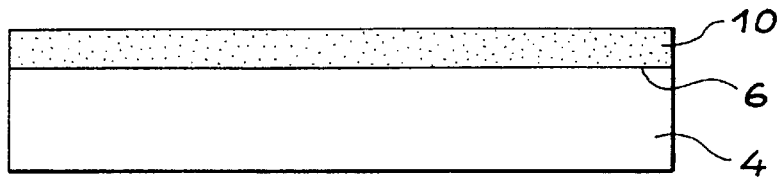
Figure 1C:
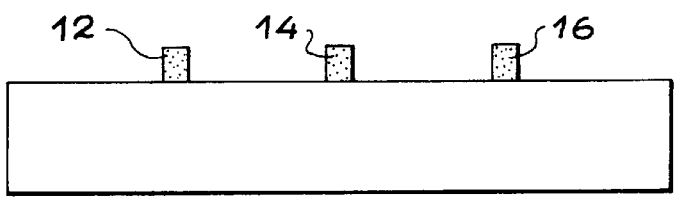

Each of these structures has a plane surface 6, 8. A layer of photo-sensitive resin is deposited on one of said surfaces (FIG. 1B).

Masked photolithography techniques are used to etch layer 10 to produce studs 12, 14 and 16. The studs are preferably distributed uniformly so that they form a layer of uniform thickness during the subsequent stage of applying pressure.

Figure 1D:
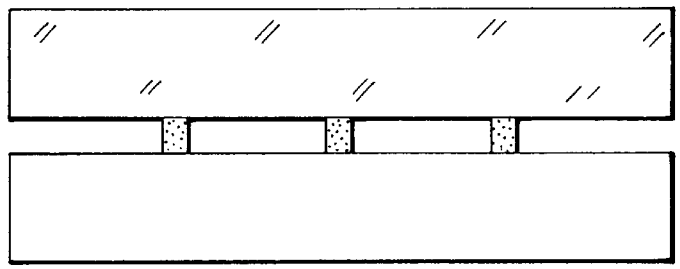
Figure 1E:
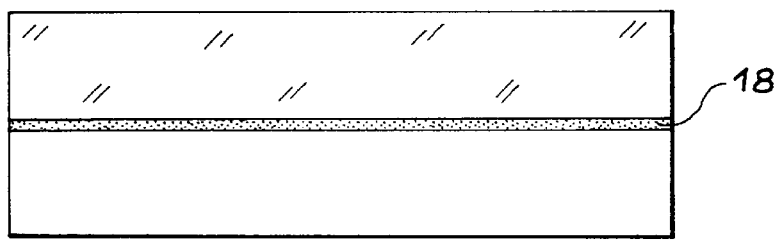

The two structures, or sections, 2, 4 are then brought face to face (FIG. 1D). By heating resin studs 12, 14, 16 under pressure, the two structures are brought into intimate contact and adhere to one another under the adhesive effect of the polymerized resin (FIG. 1E).

This stage leaves an interface layer of adhesive 18 of a thickness of the order of a few tens of microns, for example 0.1 $\mu$m. This layer 18 ensures the mechanical stability of the two structures to one another, in particular during the later cutting stage carried out, for example, using a diamond saw to produce laser cavity components. The parallelism of the two surfaces in contact with one another is ensured by the thinness of the resin. The thickness and distribution of the studs of fluidizable material 12, 14, 16 is controlled to give improved control of parallelism. Doping techniques can also be used to control the refraction index of layer 18; silica Sol-Gel can, for example, be doped with oxynitrides $SiO_xN_y$. The index jumps at the interface of materials 2, 4 can thus be adapted and loss reduced to a minimum.

The possibility of improved control over parallelism and the index of the intermediary layer is considerably more advantageous than those offered by standard "optical" glues in standard use. Moreover, as compared with a glue, the only diffusion possible from studs 12, 14, 16 between the two surfaces is very localized. A final advantage is that the thickness obtained is considerably reduced compared with that of a glue, i.e. only a few microns.

Figure 2A:
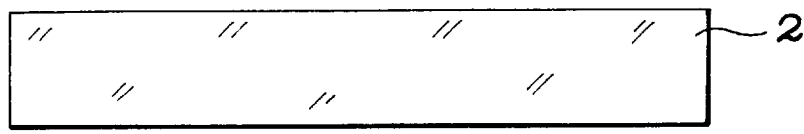
Figure 2B:
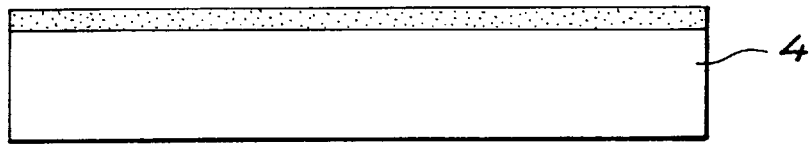

FIGS. 2A to 2G show another embodiment of a procedure according to the invention. FIGS. 2A and 2B show two more structures 2, 4 to be assembled; these may be of the same type as those described above with reference to FIGS. 1A and 1B.

The second procedure enables spacer studs to be disposed on one or other surface of the structures to be bonded, thereby defining lateral notches in which joints or studs made of fluidizable, wettable material are inserted to ensure mechanical cohesion of the assembly during subsequent cutting.

The procedure then comprises two masking levels of masking. The first level is effected after etching of one of the substrates and defines the spacer studs and notches embedded in relation to the bonding interface. The second level is designed to define the strips, or studs of fluidizable, wettable material around each spacer stud (or around each micro-component chip, e.g. microlaser) that will be embedded once the two structures are brought into intimate contact.

Figure 2C:
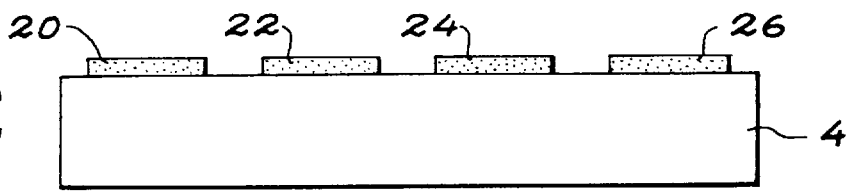
Figure 2D:
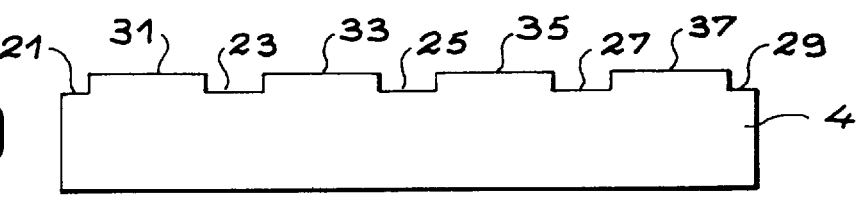

A layer 10 of photo-sensitive resin is thus first deposited on the surface of one of the structures (FIG. 2B). This layer is etched using masked photolithography techniques to create spacer studs 20, 22, 24, 26 (FIG. 2C).

Substrate 4, on which the spacer studs have been created, is then etched to define spacer studs 31, 33, 35, 37 bordered by lateral notches 21, 23, 25, 27, 29. These notches have a depth (i.e. the distance between the bottom of the notch and the upper surface of the neighboring spacer studs) measurable in $\mu$m. Where the substrate is an active laser material this etching may be effecting using ionic machining or chemical etching. Where the substrate is made of solid silica (as in a support substrate for a microlens) reactive ionic etching (RIE) techniques may also be used.

Figure 2E:
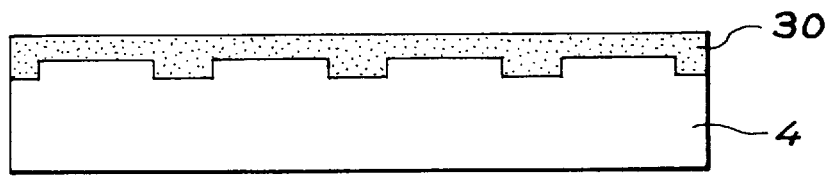

Once the resin studs 20 to 26 have been removed from the structure thereby obtained, a layer 30 of fluidizable, wettable material is spread (FIG. 2E). This layer is etched (FIG. 2F) to create connecting studs 32, 34, 36 inside notches 23, 25, 27 etched into substrate 4. Where the fluidizable, wettable material is a photo-sensitive resin, this etching may be effected by masked photolithography. Once substrates 2 and 4 have been aligned, they are assembled (FIG. 2G), for example under pressure at a temperature, T≈200° C. Intimate contact is established between surface 8 of structure 2 and the upper surface of spacer studs 31, 33, 35, 37. The spacer studs act as mechanical stops. The strips or studs 32, 34, 36 of fluidizable, wettable material may flow within the notches etched around the spacer studs. The advantage of this procedure over the first procedure disclosed in the present invention is that the bonding parameters have no influence on control of the parallelism obtained; there is no intermediate layer between structures 2, 4 after assembly.

Where the fluidizable, wettable material is a photosensitive resin, maintenance of the two substrates 2, 4 is ensured as soon as reticulation of the resin is complete.

The height of the strips or studs 32, 34, 36 is preferably greater, for example by a few microns, than the depth of the notches 23, 25, 27.

Once the two structures 2, 4 have been assembled, it is possible to cut individual components. A side view and top view of such a component is shown in FIGS. 3A and 3B respectively. Two elementary components 40, 42 present a contact surface 46. Resin studs 44-1, 44-2, 44-3, etc. ensure the mechanical maintenance of the assembly during cutting and thereafter.

Figure 4A:
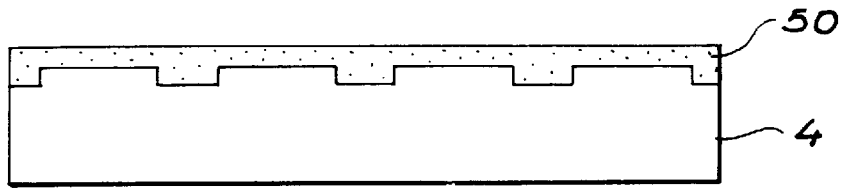
FIGS. 4A to 4E show stages in a variant of the procedure according to the second embodiment of the invention.
Figure 4B:
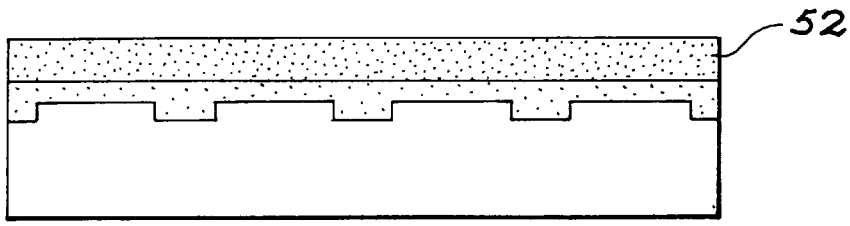
Figure 4C:
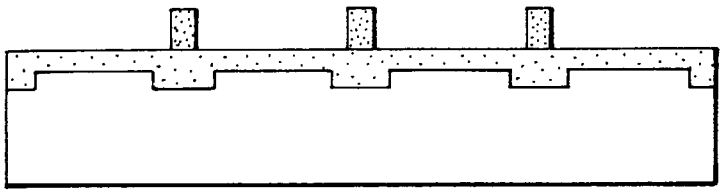
Figure 4D:
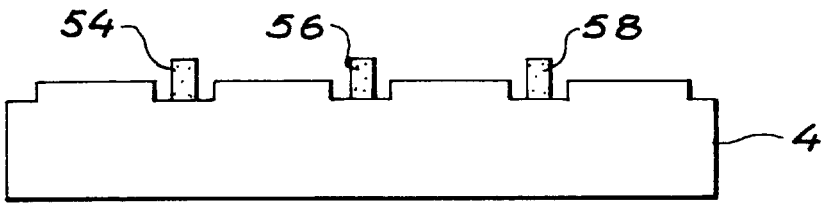
Figure 4E:
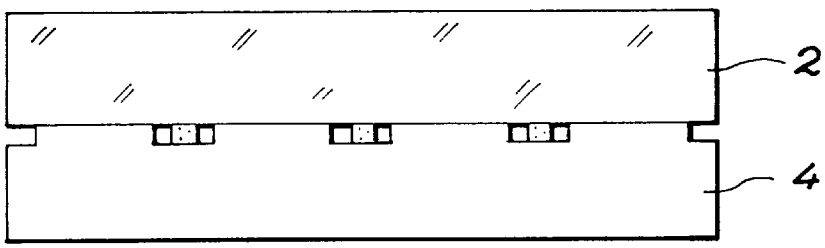
Figure 5:
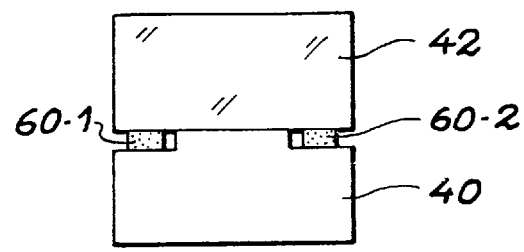
FIG. 5 shows a component made using a variant of the procedure according to the second embodiment of the invention.

In FIGS. 2F, 2G, 3A, 33 the fluidizable, wettable material is shown as discontinuous studs. It is also possible to use continuous strips of fluidizable, wettable material. However, creating discontinuous studs has the advantages of encouraging compression of the fluidizable material during bonding without overflowing from the notches and of encouraging any degassing caused by the intimate contact (e.g. solvent degassing during reticulation heating where the fluidizable material is a resin).

Where the fluidizable material used is not a resin (e.g. silica Sol-Gel or other meltable material such as In, Pb-Sn) the procedure described above with reference to FIGS. 2A to 2D is followed. Then (FIG. 4A) a layer 50 of fluidizable, wettable material is created on substrate 4. A layer 52 of photo-sensitive resin is then spread on this layer (FIG. 4B). The outline of the strips or studs forming the joints is defined in this layer 52 using a masked photolithography technique (FIG. 4C). Strips or studs 54, 56, 58 of fluidizable material may then be etched in notches 23, 25, 27 etched into substrate 4 (FIG. 4D). Substrates 2, 4 may then be aligned and assembled, for example by heating under pressure (FIG. 4E). Intimate contact is achieved at the interface of substrate 2 and spacer studs 31, 33, 35, 37, mechanical maintenance during subsequent cutting being ensured by the studs or strips of fluidizable, wettable material. Cutting produces a component comprising two elementary structures 40, 42 in intimate contact, the assembly of these two structures being maintained by studs 60-1, 60-2 made of fluidizable, wettable material (FIG. 5).

The procedure for creating spacer studs and etching notches was described above in its "single-face" version. A "double-face" may also be produced.

Figure 6A:
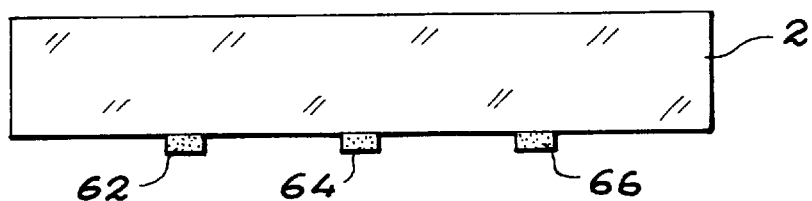
FIGS. 6A and 6B and 7A to 7C show other variants of the second embodiment of the invention.
Figure 6B:
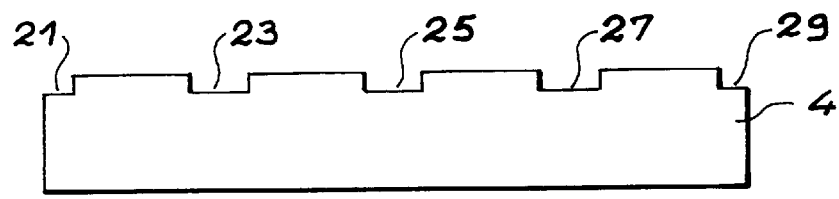

In FIGS. 6A and 6B, notches 21, 23, 25, 27, 29 are etched in substrate 4 while the strips or studs forming the joints of fluidizable, wettable material 62, 64, 66, whether made of resin or other material, are formed by techniques equivalent or identical to those disclosed above on the other structure 2. Alignment and assembly are then carried out as described above.

Figure 7A:
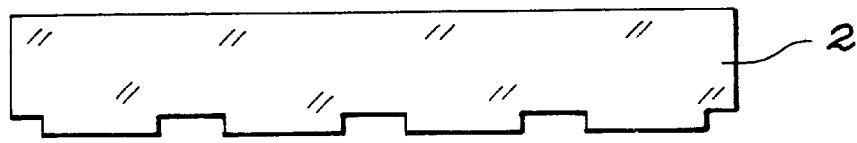
Figure 7B:
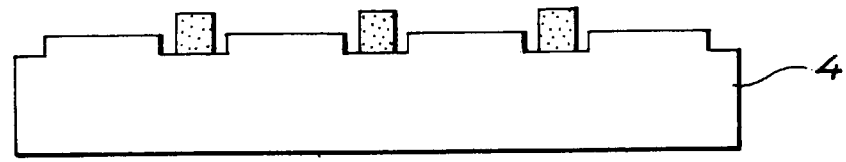
Figure 7C:
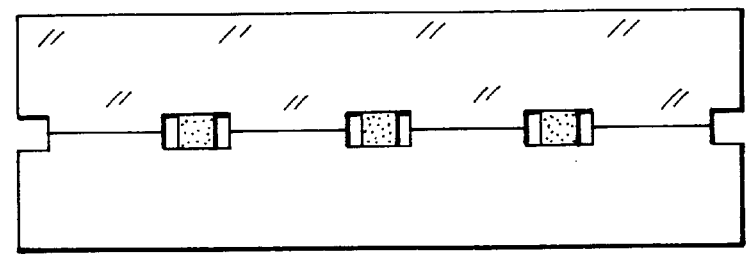
Figure 8:
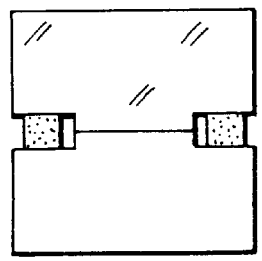
FIG. 8 shows a component produced using a variant of the procedure according to the invention.

As shown in FIGS. 7A and 7B, it is also possible to etch notches in the two substrates 2, 4, studs or strips of fluidizable, wettable material being subsequently formed on one and/or the other of the two substrates. Alignment and assembly are carried out as described above: intimate contact takes place at the surface of the spacer studs defined in each structure 2, 4 (FIG. 7C). FIG. 8 shows an individual component obtained after cutting.

Either of the procedures according to the invention described above can be applied to the hybrid assembly of microlaser components and micro-optical components. As an example, production of a microlaser actively switched by means of an external control voltage will be described.

Figure 9A:
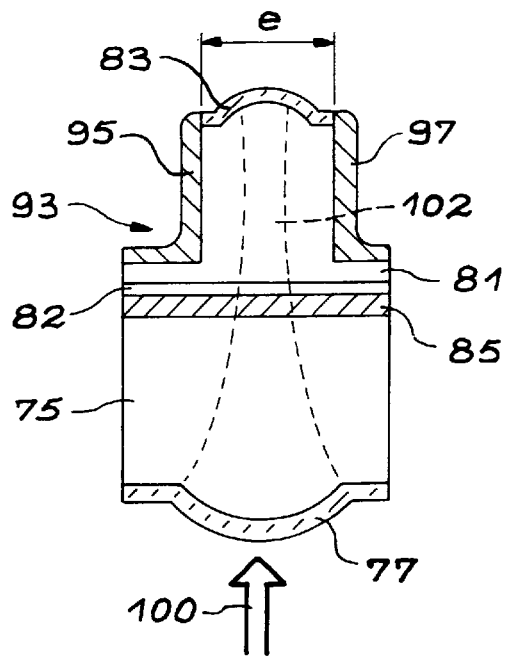
FIGS. 9A and 9B show the structure of an actively-switched microlaser produced using a procedure according to the invention.

FIG. 9A is a schematic diagram of the structure of an actively-switched microlaser chip. Reference 75 designates an active laser medium, for example a YAG medium doped with neodymium (Nd). This medium is located between an entrance mirror 77 and an intermediate mirror 85 with which it constitutes a first resonating cavity. A second resonating cavity is constituted by the intermediate mirror 85, an exit mirror 83 and a material 81 having a refractive index capable of varying with external perturbations. This material may, for example, be an electro-optical material such as $LiTaO_3$, to which a difference in potential is applied by means of two contact electrodes 95, 97. In operation, this type of microlaser structure is pumped by a pumping beam 100 obtained for example using a III–V laser diode that is either directly hybridized onto the microlaser or coupled to the microlaser via an optical fiber. A pumping beam 100 at 800 nm is suitable when material 75 is YAG doped with neodymium.

In FIG. 9A entrance micromirror 77 of the microlaser cavity has a radius of curvature capable of reducing the size of the laser beam within material 81. This radius of curvature is preferably greater than the total length of the microlaser (length $L_1$ of active medium 75+length $L_2$ of medium 81). The radius of curvature is thus typically greater than approximately 1.5 mm. This condition makes the cavity optically stable. The diameter Φ of the laser beam 102 inside the small medium 81 is typically a few tens of microns. Under these conditions, the thickness e of medium 81 required for active switching of the cavity is typically between 100 $\mu$m and 500 $\mu$m. This thickness compares very favorably with thicknesses used in the prior art: for example, the apparatus described in J. J. Zayhowski's article published in Optics Letters Vol. 17 No. 17, pp. 1201–1203, 1992, requires an electro-optical component with a thickness of 1 mm. In order for the switching mechanism to operate correctly, a thickness of 1 mm requires a voltage of the order of 1,000 volts between the two electrodes; a thickness of approximately 100 $\mu$m enables the voltage required to be limited to a value of between 50 and 100 volts.

The structure shown in FIG. 9A also has a concave micromirror 83 at the microlaser exit. In this situation the radii of curvature $R_1$ and $R_2$ of micromirrors 77, 83 are chosen to give two optically stable cavities. Where two cavities are coupled as in FIG. 9A, $R_1 > L_1$ and $R_2 > L_2$ to meet this requirement. In a plane-concave cavity (the exit mirror is plane), $R_2 = \infty$.

The invention can be applied similarly to the creation of a plane-plane structure, the only difference being the greater thickness e of electro-optical material 81.

The microlaser shown in FIG. 9A comprises two structures: the first composed of the active laser medium 75 and mirrors 77, 85, and the second composed of electro-optical material 81, exit mirror 83 and electrodes 95, 97. These two structures are assembled using the first embodiment of the procedure according to the invention, and reference 82 designates a joint obtained after compressing studs of fluidizable, wettable material, the electro-optical material 81 and the mirror 85 being in intimate contact.

Figure 9B:
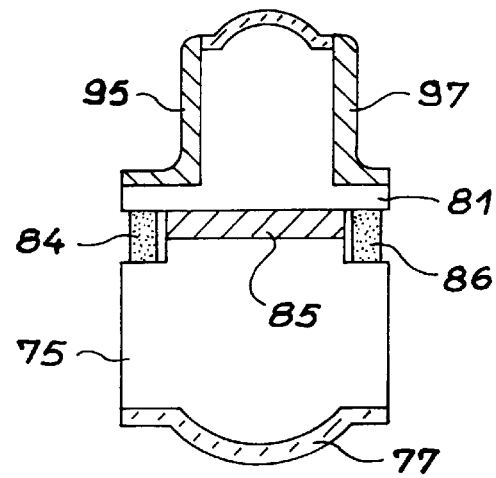

FIG. 9B shows a variant of the above structure in which the mirror 85 and the electro-optical material 81 are in intimate contact without an intermediate joint; studs 84, 86 of fluidizable, wettable material are formed in the lateral notches, the active laser medium 75 and the mirror 85 having been etched to create said notches. This structure is an actively-switched microlaser obtained using the second embodiment of the procedure according to the invention.

The stages in the procedure used to produce the structure in FIG. 9A will be briefly summarized with reference to FIG. 10A to 11F and 11A to 11E.

1)—In a first stage the radii of curvature $R_1$ and $R_2$ are calculated if stability of either cavity is required.

2)—In a second stage (FIGS. 10A, 10B) a section 75 of laser material and a section 81 of material with a variable index such as an electro-optical material (e.g. $LiTaO_3$) are subjected to cutting and polishing of both faces.

Figure 11A:
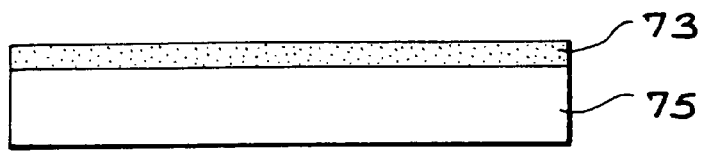
Figure 11B:
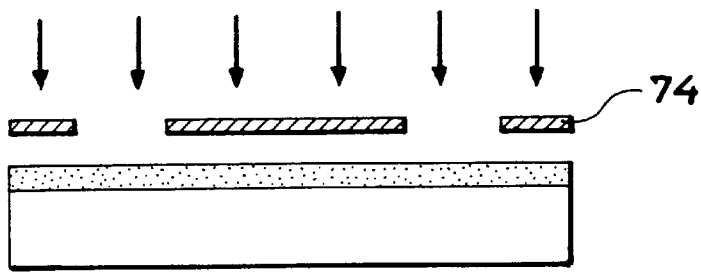
Figure 11C:
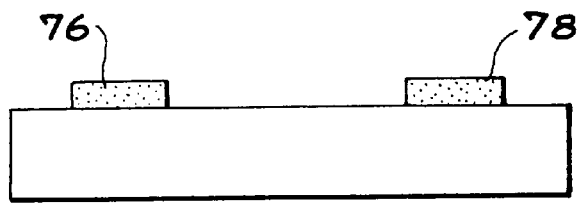
Figure 11D:
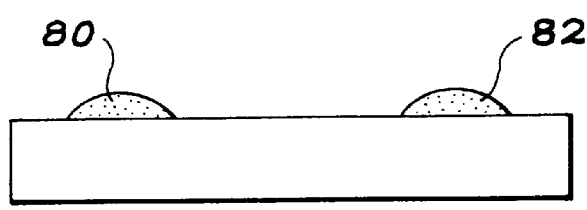
Figure 11E:
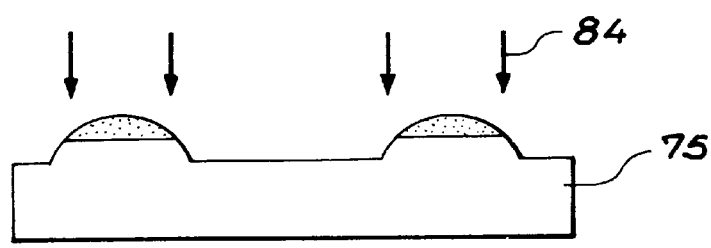

3)—Photolithography and machining techniques are next used to create a micromirror on the entrance face of the laser material (typical diameter 100 to 500 µm and radius of curvature $R_1$ of 1 to 2 mm). This stage is illustrated in FIGS. 11A to 11E. In a first sub-stage (FIG. 11A) a layer of photosensitive resin 73 is deposited on the entrance face of laser material 75. The resin is then insolated through a mask 74 using UV radiation (FIG. 11B). In the next stage (FIG. 11C), the resin is chemically removed leaving only studs 76, 78 designed to form the micromirrors. In the next stage the resin is thermally fluidized (FIG. 11D) to form resin mirrors 80, 82 and laser material 75 is machined using an ion beam 74 (FIG. 11E) to transfer the shape until the resin has been eliminated.

Stages 4) to 9) will now be described with reference to FIG. 10C.

4)—Entrance mirror 77 is deposited on the entrance face of laser material 75 (e.g. for the dichroitic entrance mirror with a reflectivity greater than 99.5% at the wavelength of the laser beam and transmission greater than 80% at the pumping beam wavelength).

5)—Photolithography and machining techniques are next used to produce micro-projections 79 as described above on the exit surface of electro-optical material 71 (typical diameter 100 to 500 µm and radius of curvature $R_2$ of 1 to 2 mm). No micro-projections are created on the exit surface of the electro-optical material if the exit mirror is to be plane. The diameter of the exit mirror (microlens) may be less than the diameter of the entrance micromirror.

6)—The exit micromirror 83 is next deposited on the exit face of the electro-optical material 81 (exit mirror with typical reflectivity of 85 to 99% at the laser beam wavelength and possibly with a reflectivity greater than the pumping wavelength to reflect the pumping beam that is not totally absorbed on its first passage).

7)—In the seventh stage an intermediate mirror 85 is deposited at the interface between the laser material 75 and the electro-optical material 81.

8)—Section 81 and mirror 85 are then brought into intimate contact (FIG. 10E) and mechanically bonded by joint 82 made of fluidizable, wettable material; in conformance with the invention this joint is composed of studs 86-1, 86-2, 86-3, etc. previously deposited on the surface of, for example, mirror 85.

Figure 10A:
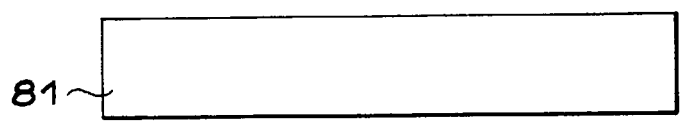
FIGS. 10A to 10F and 11A to 11E show stages in producing an actively-switched microlaser using a procedure according to the invention.
Figure 10B:
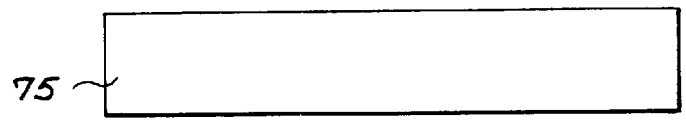
Figure 10C:
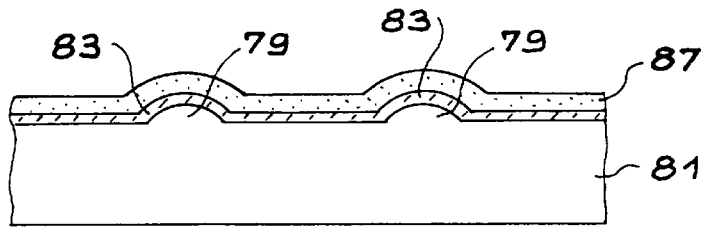
Figure 10D:
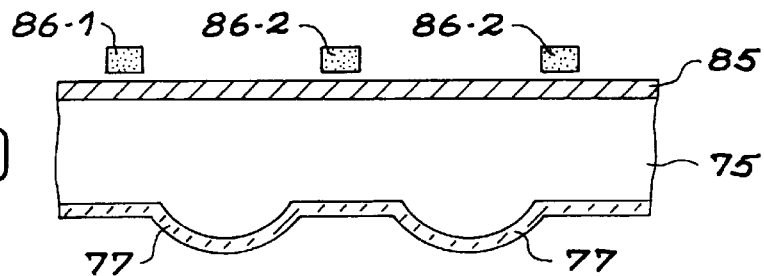
Figure 10E:
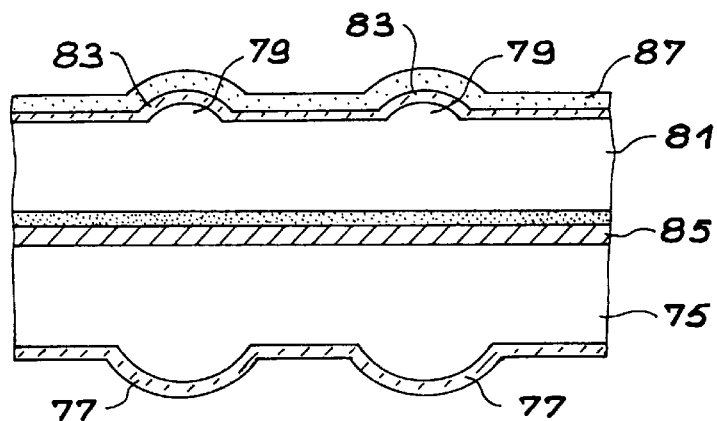
Figure 10F:
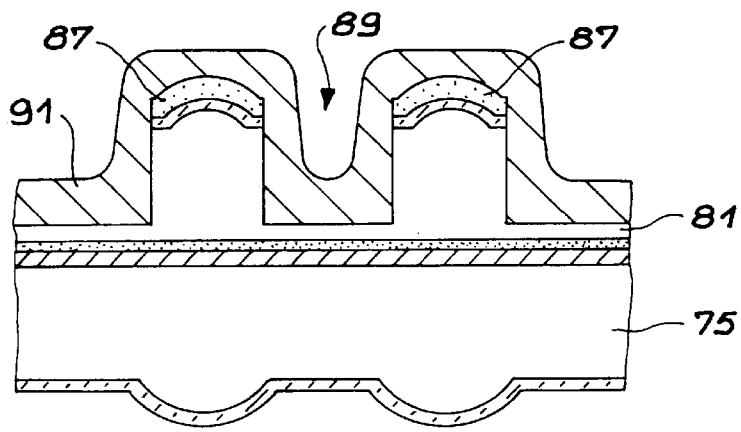

9)—The exit surface may be protected by a resin deposit 87 (FIG. 10C).

10)—It is possible to make grooves 89 (FIG. 10F) in the electro-optical material using a microelectronics diamond saw in order subsequently to be able to form the electrodes with the required spacing e (of the order of 100 µm compared with a gap between electrodes of 1 µm in the prior art).

11)—Evaporation techniques are next used to deposit the electrical contacts (e.g. deposit of a Cr-Au layer 91 coating resin 87 and electro-optical material 81).

12)—Individual chips 93 measuring more or less 1 mm² are then cut out. Once the protective resin has been chemically removed and layer 91 lifted off, the structure shown in FIG. 9A is obtained.

13)—The chips are fitted onto a metallized printed circuit with suitable impedance; an electricity supply and shielded housing are also provided.

14)—The units may also be placed in a housing and connected to pumped laser diodes and an electric switching connector.

Figure 12:
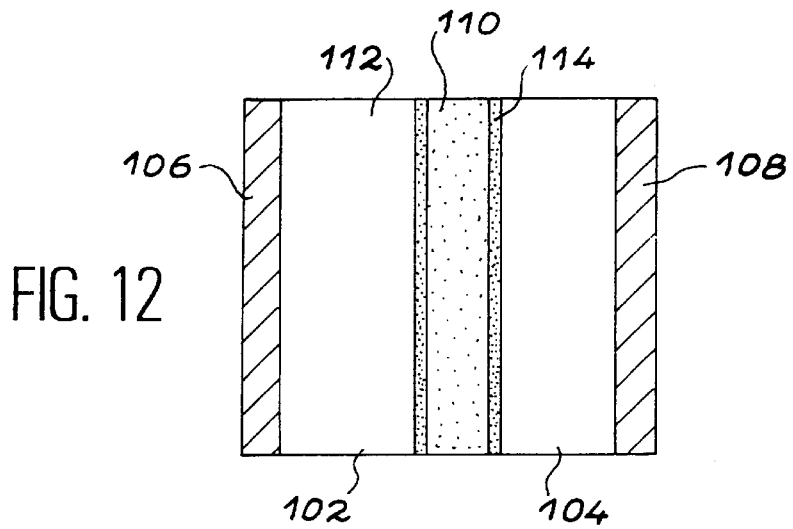

The invention may also be applied to any microlaser cavity structure. For example, FIG. 12 shows a microlaser cavity comprising an active laser medium 102, an entrance mirror 106 and an exit mirror 108. Two other components are located inside the cavity:

a component 110 for switching the cavity in active or passive mode.

a component 104 made of a non-linear material capable of multiplying the basic frequency of the active laser medium 102 by a factor n (n≧2).

As can be seen from FIG. 12, two joints 112, 114 of a fluidizable, wettable material are disposed respectively at the interfaces of the active laser medium 102 with the switching component 110, and the switching component 110 with the non-linear medium 104. The simultaneous presence within the cavity of switching means and the non-linear component 104 results in a considerable increase in operating output of the non-linear medium 104.

In a variant not shown in the figures, notches can be etched in the active laser medium and the switching component 110 in order to produce a structure incorporating lateral notches to accept joints made of the fluidizable, wettable material; the interface between components 102 and 110, and 110 and 104 is then achieved by intimate contact without a transverse joint. This enables a switched microlaser cavity to be produced with multiple frequencies and operating at optimum output; the pumping beam and laser beam encounter no joint as they pass through the cavity.

FIG. 12 shows a plane-plane cavity. A stable cavity can also be produced with concave micromirrors on cavity entrance and/or exit. The stable cavity will have a weaker switching threshold and improved output. Moreover, the presence of a concave micromirror enables the size of the laser beam in the various mediums within the cavity to be adjusted, giving increased power density in the saturable absorber component 110 and the multiplying crystal 104. In order to produce this type of structure additional preparation stages are required for the laser material plates, switching material and non-linear material, all of which are superimposed and bonded using one of the procedures described in the present application.

Figure 13:
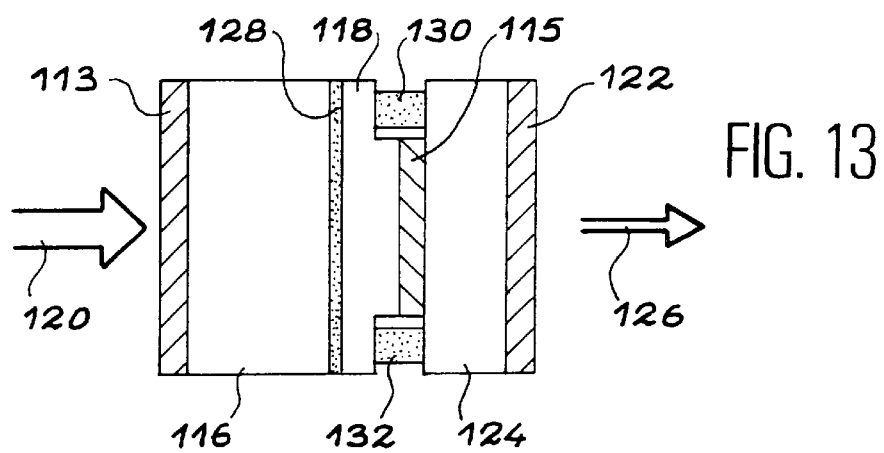

FIG. 13 shows another structure that can be obtained using a procedure according to the invention. References 112 and 114 designate entrance and exit mirrors of a microlaser cavity that comprises an active laser medium 116 and means 118 for switching said cavity in active or passive mode. Reference 120 is a pumping beam of the cavity. The cavity emits a laser beam that in turn pumps an optical parametric oscillator (OPO) structure essentially comprising two mirrors 114, 122 between which is disposed a non-linear material 124. This cavity in turn emits an OPO beam 126.

The material constituting medium 124 may be selected from known non-linear materials such as, for example, $KTiPO_4$ (KTP), $MgO;LiNbO_3$, $\beta\text{-}BaB_2O_4$, $LiB_3O_5$ and AgGaSe. The properties of KTP materials are described, for example, in an article by Terry et al. published in the Journal of the Optical Society of America, B, Vol. 11, pages 758–769 (1994). The properties of other non-linear materials that can be used to construct an OPO are described in R. W. Boyd "Non-Linear Optics" (Academic Press, USA, 1992, ISBN 0-12-121680-2), particularly p. 85 et seq.

Pumping with a microlaser makes it possible not only to reduced the threshold energy of the OPO cavity, but also to reduce the length of the crystal 124 required for operation of the OPO: for example, in the article by Terry et al. cited above a 20 mm long crystal is described, whereas the present invention makes it possible to use materials only a few mm thick, e.g. 5 mm. Generally speaking, the properties of the beam emitted by the laser make these properties (i.e. reduced energy threshold and reduced crystal length) applicable not only to the KTP crystal described in the article by Terry et al. but also to any other crystal or non-linear material used to produce an OPO cavity.

The structure shown in FIG. 13 is extremely compact. Since the microlaser cavity itself is very compact (even including a switching component 118), it is possible to produce an OPO with a total length, including pumping means, not exceeding 6 mm with a cross-section of 1 mm$^2$, i.e. a total volume of 6 mm$^3$.

The apparatus shown in FIG. 13 also comprises a joint 128 made of a fluidizable, wettable material that provides an intimate contact connection between the active laser medium 116 and the switching medium 118. The contact between mirrors 114 and component 124 is also assured by intimate contact but the joints or studs 130, 132 of fluidizable, wettable material are located in the lateral notches etched into the switching component 118 and the mirror 114. It is also possible to produce a variant (not illustrated in the figures) in which the connection between the active medium 116 and the switching component 118 is ensured by intimate contact without the transverse joint 128, the joints of fluidizable, wettable material being disposed in lateral notches etched, for example, in the active laser medium 116. In this configuration the pumping and laser beams encounter no joint inside the apparatus, enabling the optical parametric oscillator to operate at optimum output. The procedures used to produce this component are the same as described above.

Figure 14:
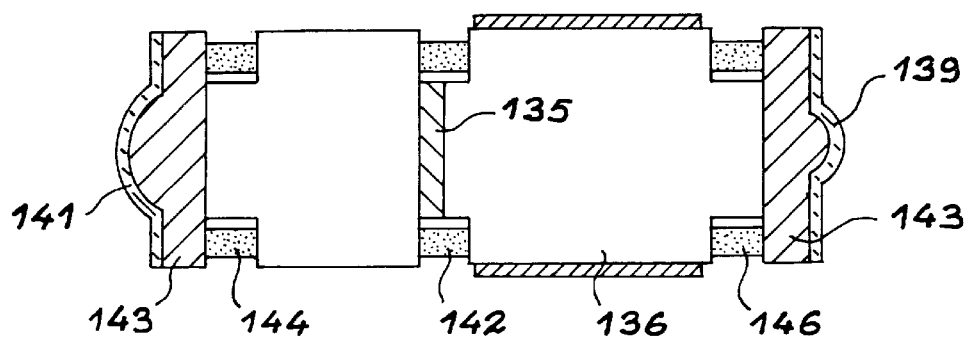

Another structure that can be produced using a procedure according to the invention comprises an active laser medium 134 (FIG. 14) situated between an entrance micromirror 141 and an intermediate mirror 142. Active switching means 136 are disposed between the intermediate mirror 142 and an exit mirror 139. Micromirrors 139, 141 are produced as plates on a material 143 such as glass or silicon that is transparent at laser wavelengths. These substrates comprising micromirrors may then be assembled together with the active laser medium 134 and the active switching component 136 according to one of the procedures described in the present application. In FIG. 14 components 134, 136 have been etched to produce notches in which studs 142, 144, 146 made of fluidizable, wettable material are incorporated to ensure the mechanical resistance of the various components of the microlaser. The connection between different components is by intimate contact, giving excellent parallelism.

In a variant, the apparatus shown in FIG. 14 may also be produced using the first embodiment disclosed above so that the joints are disposed transversally.

Figure 15:
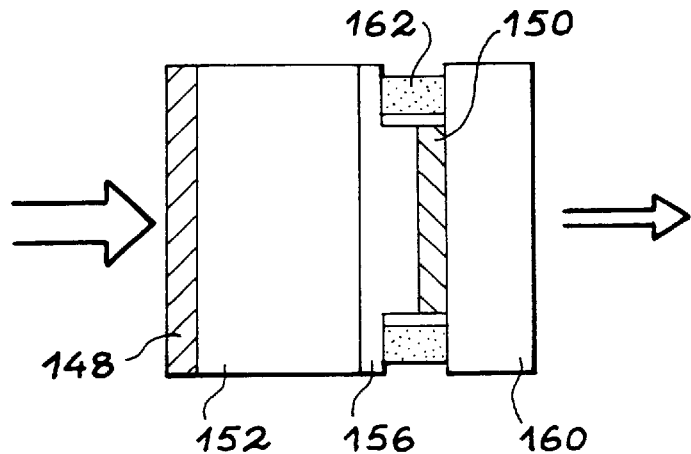
FIGS. 12 to 15 show the structures of microlasers according to the invention.

FIG. 15 is a schematic diagram of another microlaser cavity structure that can be produced using a procedure according to the invention. This structure comprises an active laser medium 152, means 156 for switching the microlaser cavity in active or passive mode; said cavity being defined by entrance and exit mirrors 148, 150. The cavity is pumped by optical means that are not shown in the figure. Pulses emitted by the microlaser are absorbed by semiconductor component 160. The microlaser is a compact, robust source that can be integrated to produce a monolithic structure; it has enough power to reach the laser threshold of any semiconductor, even those with very high thresholds, irrespective of temperature (e.g. $Pb_xSn_{1-x}Se$, $Pb_xSn_{1-x}Te$, $Pb_xSn_{1-x}Se_x$, $Cd_xPb_{1-x}S$, $InAs_xSb_{1-x}$, $Cd_xHg_{1-x}Te$, $Bi_{1-x}Sb_x$, $0 \leq x \leq 1$, all these compounds giving wavelengths $\lambda \geq 1$ $\mu$m but, with conventional pumping means, at temperatures below 160K; this also applies to InAsSb ($InAs_xSb_{1-x}$) type alloys on InAs substrates).

The semiconductor component may be a section of a thickness of several hundred microns, or may be part of a semiconductor laser, of the VCSEL type, for example.

Semiconductor component 160 is connected to switching component 156 by studs 162 made of fluidizable, wettable material and is in intimate contact with mirror 150. In a variant, a joint of fluidizable, wettable material provides the mechanical link at the interface between the mirror component and the semiconductor, while the two surfaces are still in contact via the joint.

A microlaser output can be obtained that peaks at several kilowatts with a diameter of 20 to 100 $\mu$m, i.e. power densities of several tens of megawatts per cm$^2$. This power density enables a laser effect with optical pumping to be obtained for most known semiconductors.

The power emitted by the semiconductor is thus typically of the order of several tens of milliwatts.

Moreover, the reduced length of microlaser cavity (less than or equal to 1 mm) ensures that pulses are short (typically less than 1 nanosecond; maximum 5 nanoseconds) which avoids any thermal load that could damage the semiconductor.

In optical or optronics applications in general, the material used to produce the studs is selected for its optical compatibility, i.e. inducing the minimum optical loss from beams. A material is therefore chosen that has a refractive index as close as possible to that of the structures to be assembled. This is particularly the case with structures produced using the first embodiment of the procedure of the invention, i.e. where no notches to accept joints made of fluidizable, wettable material are made. Where a silica material (silica Sol-Gel) is used, the refractive index can be adjusted by doping, for example with oxynitrides $SiO_xN_y$; the index jumps at the interface of the materials can thus be adapted and optical loss correspondingly reduced.

We claim:

1. Procedure for assembling two structures comprising:
   formation on at least one of the structures of studs of a fluidizable, wettable material on the two structures by depositing a layer of said material and etching of the same,
   positioning of the two structures so that the studs are at the interface,
   assembly of the two structures by heating the studs, causing them to flow in order to obtain a continuous joint, and by bringing the two structures together as closely as possible.

2. Procedure for assembling two structures comprising:
   formation of at least one spacer stud in the first of the two structures, the edges of said spacer stud(s) defining one or more lateral notches, each lateral notch presenting a bottom and a depth,
   the creation on the bottom of at least one lateral notch of a joint made of a material that is fluidizable and wettable on the two structures, said joint having a height greater than or equal to the depth of said notch,
   positioning of the two structures such that said joint is at the interface,
   assembly of said structure by heating the joints causing them to flow, and by bringing the two structures together as intimately as possible.

3. Procedure of claim 2 wherein at least one spacer stud is also created in the second structure, the edges of said spacer scud(s) defining one or more lateral notches, each lateral notch presenting a bottom, the positioning of the two structures being such that a spacer stud of the first structure is located facing a spacer stud of the second structure.

4. Procedure according to claim 1 or 2 in which the fluidizable, wettable material is a photosensitive resin or a meltable material of the silica Sol-Gel (SOG) type, or an In or Pb-Sn metal alloy.

5. Procedure according to claim 1 or 2 in which the fluidizable, wettable material is a negative resin.

6. Procedure according to claim 1 or 2 in which the heating of the studs and bringing the two structures together takes place by heating the two structure under pressure.

7. Procedure according to claim 1 or 2 comprising a subsequent stage in which the two assembled structures are cut.

8. Procedure for assembling two structures comprising:

formation of at least one spacer stud in the first of the two structures, the edges of said spacer stud(s) defining one or more lateral notches, each lateral notch presenting a bottom and a depth, the creation on the second structure of at least one joint made of a fluidizable, wettable material on the two structures, said joint having a height greater than or equal to the depth of said notch, positioning of the two structures such that each joint of the second structure is inserted into a notch in the first structure, assembly of the two structures by heating the joints causing them to flow, and bringing the two structures together to the maximum.

9. Procedure according to claim 8 wherein the fluidizable, wettable material is a photosensitive resin or a meltable material of the silica Sol-Gel (SOG) type, or an In or Pb-Sn metal alloy.

10. Procedure according to claim 8 or 9 in which the fluidizable, wettable material is a negative resin.

11. Procedure according to claim 8 or 9 in which the heating of the studs and bringing the two structures together takes place by heating the two structure under pressure.

12. Procedure according to claim 8 or 9 comprising a subsequent stage in which the two assembled structures are cut.

13. Procedure according to claim 2 or 8, wherein the assembling of the two structures allows the two structures to be in contact.

* * * * *